United States Patent [19]

Metz et al.

[11] Patent Number: 4,536,666

[45] Date of Patent: Aug. 20, 1985

[54] TRIGGER COUPLING CIRCUIT FOR PROVIDING A PLURALITY OF COUPLING MODES

[75] Inventors: Arthur J. Metz, Gervais; Kenneth G. Schlotzhauer, Beaverton, both of Oreg.

[73] Assignee: Tektronix, Inc., Beaverton, Oreg.

[21] Appl. No.: 444,765

[22] Filed: Nov. 26, 1982

[51] Int. Cl.3 ....................... H03K 17/04; H03K 5/07; H03K 3/023

[52] U.S. Cl. .................................... 307/494; 307/510; 307/520; 307/522; 307/543; 328/167

[58] Field of Search ............... 307/491, 492, 493, 494, 307/495, 496, 497, 499, 520, 521, 522, 526, 525, 529, 511, 543, 544, 556, 540, 510; 330/107, 109; 328/187, 179, 165, 166, 167, 181

[56] References Cited

U.S. PATENT DOCUMENTS 3,278,866 10/1966 Bose ................................ 307/520 X
3,322,970 5/1964 Batteau ................................ 307/511
3,424,867 1/1969 Monnier .......................... 328/187 X
3,446,996 5/1969 Toffler ................................ 307/520
4,293,819 10/1981 Shibayama et al. ............ 330/107 X
4,322,641 3/1982 Packard .......................... 307/543 X
4,462,008 7/1984 Katakura ........................ 307/542 X

OTHER PUBLICATIONS

Parker, *Encyclopedia of Electronics and Computers*, p. 326, 1982, (examiner's book).

*Primary Examiner*—Stanley D. Miller
*Assistant Examiner*—David R. Bertelson
*Attorney, Agent, or Firm*—George T. Noe

[57] ABSTRACT

A programmable trigger coupling circuit and trigger circuit for selecting DC and AC coupling modes in addition to a few other coupling modes without using a DC blocking capacitor in series with the signal path. A short high frequency signal path, low pass filter network and a subtraction circuit are used for obtaining the basic trigger coupling modes. Additional circuits may be used for expanded coupling modes and functions.

15 Claims, 6 Drawing Figures

42 L 46 44 AC 52 48 DC 50

42 L A 52a 54 B 60a 60b 46 44 48 56 C 52b 58a 58b D 50 E

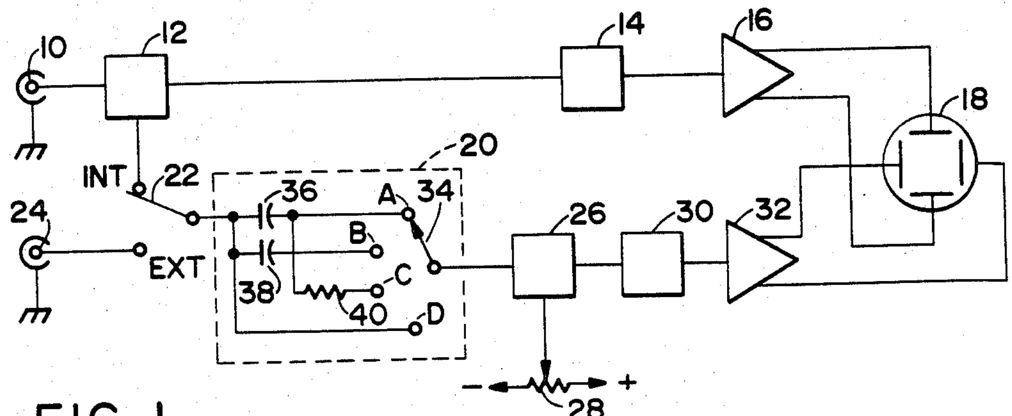
FIG. 1.
(PRIOR ART)
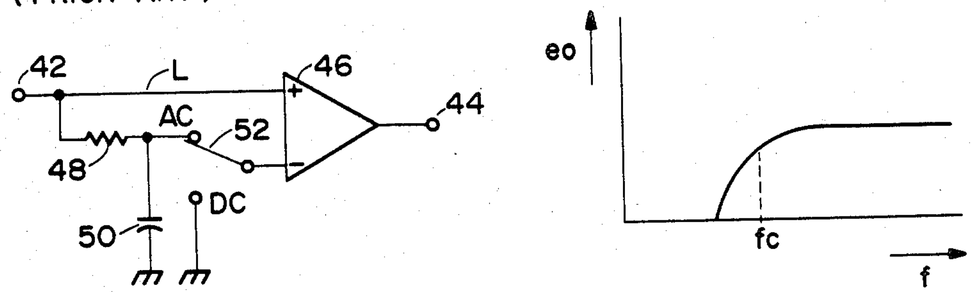
FIG. 2A.
FIG. 2B.
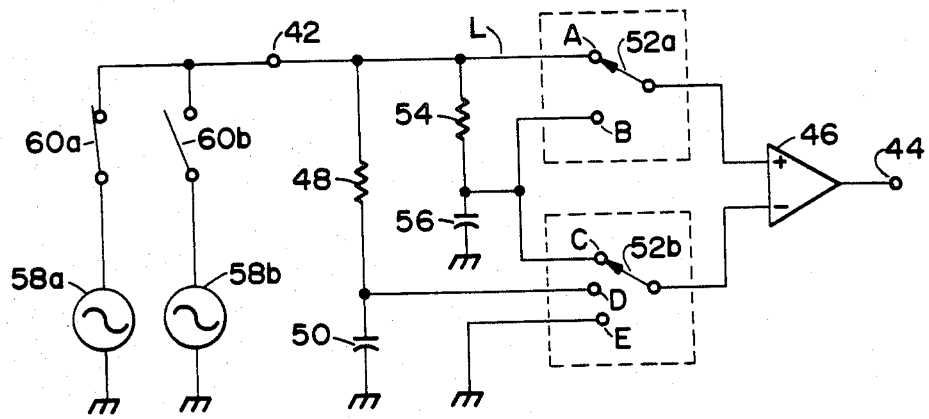
FIG. 3.

TRIGGER COUPLING CIRCUIT FOR PROVIDING A PLURALITY OF COUPLING MODES

BACKGROUND OF THE INVENTION

The present invention relates generally to a programmable trigger coupling circuit, and more particularly to a trigger circuit for generating a trigger pulse in response to a selected signal component of an input trigger signal.

Trigger circuits have been widely used in various electronic test and measurement instruments such as, for example, oscilloscopes, frequency counters, and universal counters/timers in order to actuate a circuit or initiate some predetermined signal. One primary function includes selection of an input signal portion to be displayed or measured.

To gain a better understanding of the present invention, a conventional trigger coupling circuit used in an oscilloscope will be described with reference to FIG. 1. An input signal to be displayed is applied to input connector 10. Connected to input connector 10 is a vertical channel for conditioning the input signal before driving the vertical deflection plates of cathode ray tube (CRT) 18, and such vertical channel includes input circuit 12, which typically consists of a signal coupling circuit, a multi-step attenuator and an input amplifier, delay line circuit 14, and vertical output amplifier 16. A horizontal deflection system includes mode selection switch 22, coupling circuit 20, trigger generator 26, sweep generator 30 and horizontal output amplifier 32. Mode selection switch 22 selects a triggering signal from either internal (INT) or external (EXT) sources. An external triggering signal is applied to external input connector 24. Trigger generator 26 generates a trigger pulse by comparing the triggering signal from trigger coupling circuit 20 with a controllable trigger level from trigger level control potentiometer 28.

In operation, the vertical channel drives the vertical deflection plates of CRT 18 with a push-pull deflection signal voltage of certain amplitude determined by attenuating and then amplifying the input signal to suitable levels. The horizontal deflection system generates linear ramp (sawtooth) signals of different rates to produce a timebase. The trigger generator circuit is used to actuate the ramp signal in synchronism with the input signal to be displayed on the CRT screen as a stable waveform.

One objective of trigger coupling circuit 20 is to preclude the possibility of undesired signal components of the trigger signal reaching trigger generator 26. The most simple oscilloscopes have only AC and DC coupling modes, but more sophisticated laboratory instruments have additional coupling modes such as low frequency reject (LF REJ) and high frequency reject (HF REJ) modes, such as is shown in FIG. 1. When coupling selection switch 34 is in AC coupling position A, coupling capacitor 36 is connected in series with the signal path to block DC and very low frequency components. This mode is particularly useful when triggering on small AC signal components superimposed with a large DC signal. A DC coupling mode is selected at position D of coupling selection switch 34 and useful for triggering on very low frequency signal or on a predetermined DC level of the input signal, since the entire signal is passed to trigger generator 26 in this mode.

At position B of coupling selection switch 34, LF REJ mode is selected in which the trigger signal is coupled to trigger generator 26 through capacitor 38 of relatively low capacitance, thereby attenuating the input signal components substantially below a predetermined low frequency. This mode is particularly useful when low frequency noise such as power supply ripple is included in the signal. HF REJ mode is selected at the position C of coupling selection switch 34 in which the trigger signal is coupled through capacitor 36 to a resistor 40 and a capacitor to ground (not shown). This mode is essentially the same as the AC mode with the exception of attenuating high frequency components over some predetermined value. This mode will stably trigger input signals with large amounts of HF noise, and display modulated signal waveforms.

Drawbacks of prior art trigger coupling circuits are the use of bulky coupling capacitor 36 in series with the signal path and difficulty in selecting different coupling modes by electronic means. The use of such a capacitor is an obstacle to the implementation of all oscilloscope circuits in one or a few integrated circuits (LSIs). Additionally, loss of bandwidth due to stray capacitance is a problem.

SUMMARY OF THE INVENTION

The present invention overcomes the aforementioned disadvantages of the conventional trigger coupling circuits by using one short direct high frequency signal path, minimum number of single pole filter sections and a subtractive circuit (differential amplifier). Since no capacitor is in series with the high frequency signal path, the entire circuit is easily implemented in a monolithic integrated circuit (IC) form. Additionally, the use of two or more single pole filters provides unique coupling functions. Moreover, the stray capacitance and inductance of the coupling capacitor do not load the high frequency path, but appear in a low frequency path where they cause no degradation.

It is therefore one object of the present invention to provide an improved trigger coupling circuit which excludes a coupling capacitor in series with the high frequency signal path.

It is another object of the present invention to provide a programmable trigger coupling circuit.

It is yet another object of the present invention to provide a substantially simplified trigger coupling circuit with various coupling modes.

It is still another object of the present invention to provide a novel trigger coupling circuit particularly suited for high frequency (wideband) applications.

It is additional object of the present invention to provide an improved trigger circuit for an oscilloscope or similar apparatus.

These and other objects of this invention as well as operation and advantages will best be understood from the following detailed description of this invention by reference to the accompanying FIGS. 2 through 5.

BRIEF DESCRIPTION OF THE DRAWINGS

FIG. 1 is a block diagram of a conventional oscilloscope to explain how a trigger coupling circuit is used;

FIG. 2A is a simplified circuit schematic to show the principle of the trigger coupling circuit according to the present invention;

FIG. 2B shows the frequency response for the circuit of FIG. 2A;

FIG. 3 is a more sophisticated trigger coupling circuit according to the present invention;

DETAILED DESCRIPTION OF THE PREFERRED EMBODIMENTS

Figure 4:
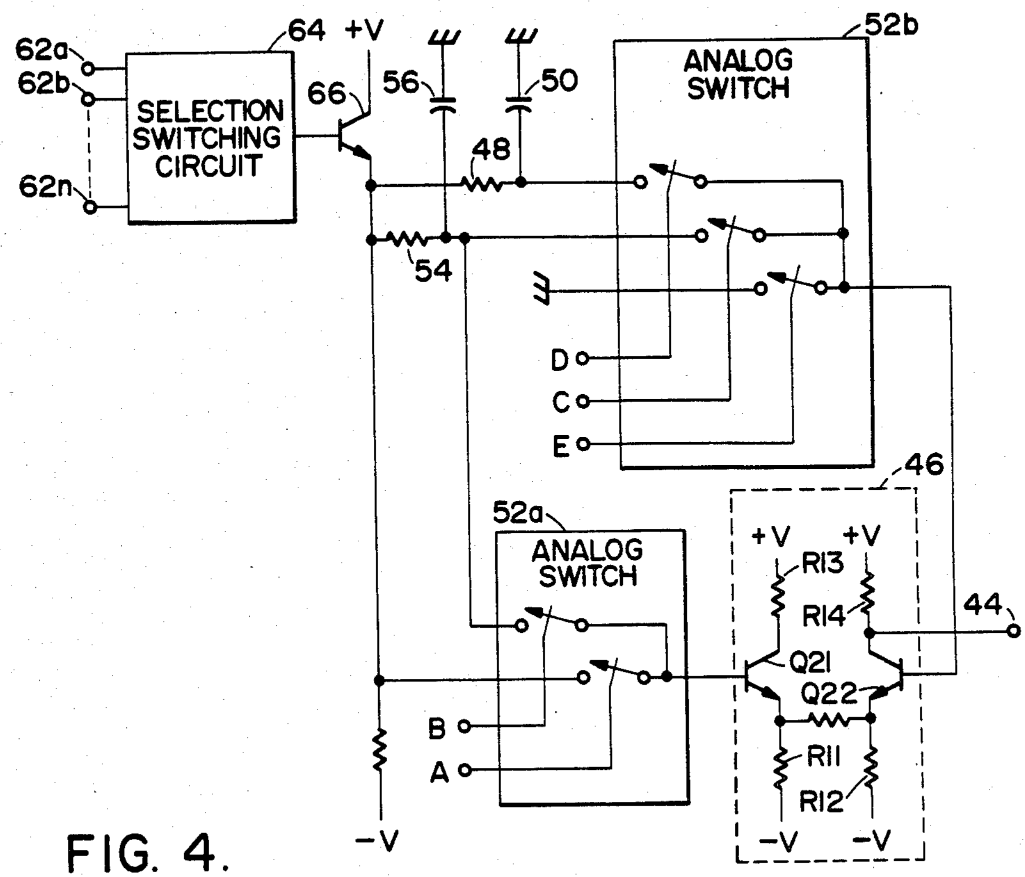
FIG. 4 is a circuit schematic of a practical programmable trigger coupling circuit according to the present invention.

Referring now to FIG. 2, a wideband trigger input signal at input terminal 42 is applied directly to a first input terminal of subtractive circuit or differential amplifier 46 via a direct signal path L and also to a single pole low pass filter circuit including series resistor 48 and shunt capacitor 50. Interposed between the output of the filter and a second input of differential amplifier 46 is a coupling mode selection switch 52 which selects either AC or DC trigger coupling mode. In the DC coupling mode, the second input terminal is returned to ground, thereby amplifying the wideband trigger signal over the full bandwidth of differential amplifier 46.

In the AC coupling mode, switch 52 transmits the filtered voltage across capacitor 50 to the second input of differential amplifier 46. The input signals to both inputs of differential amplifier 46 are equal to each other for DC and low frequency components lower than the cutoff frequency ($f_c$) of the filter network, thereby cancelling each other and producing no output signal at output terminal 44 of differential amplifier 46. Essentially no signal is transmitted to the second input when the trigger input signal frequency exceeds the $f_c$ of the filter. As a result, the entire frequency response will be shown in FIG. 2B. The cutoff frequency $f_c$ of the filter network may be chosen to be any desired value, for example, 30 Hz. It should be noted that the signal path for the filter network may not necessarily be as short as the direct signal path L because only very low frequency signal components pass through such filter network.

Shown in FIG. 3 is a programmable trigger coupling circuit particularly suited for more sophisticated oscilloscopes. For convenience, similar reference numerals to FIG. 2 are used to refer to like elements. In this embodiment, short high frequency signal path L is also provided between input terminal 42 and the non-inverting input of differential amplifier 46 via first coupling mode selection switch 52*a*. Two filter networks of different cutoff frequencies ($f_{c1}$ and $f_{c2}$) are connected between input terminal 42 and ground: a first filter with cutoff frequency $f_{c1}$ consisting of resistor 48 and capacitor 50 and a second filter with cutoff frequency $f_{c2}$ consisting of resistor 54 and capacitor 56. Interposed between filter networks and the inverting input of differential amplifier 46 is second coupling mode selection switch 52*b*. First switch 52*a* has two fixed contacts A and B connected respectively to input terminal 42 and the output of the second filter network. Second switch 52*b* has three fixed contacts C, D and E connected respectively to (1) the output of the second filter network, (2) the output of the first filter network and (3) ground. In this particular embodiment, a pair of input signal sources 58*a* and 58*b* are selectively connected to input terminal 42 through switches 60*a* and 60*b*. For example, signal sources 58*a* and 58*b* may represent the internal and external trigger signals in FIG. 1, respectively. An additional line signal source may be used to generate trigger pulses in synchronism with its power line frequency.

Let us assume that $f_{c1}$ is 30 Hz and $f_{c2}$ is 50 kHz. It may now be understood that the circuit operates essentially as the AC and DC coupling modes hereinabove described when first switch 52*a* is in position A and second switch 52*b* is switched between position D and E. In addition to the foregoing two basic coupling modes described above, this embodiment provides three other useful coupling modes including LF REJ, HF REJ/DC and HF REJ/AC described below. The LF REJ coupling mode is realized when switch 52*a* is in position A and switch 52*b* is in position C. In this mode, input signal components below 50 kHz are rejected, thereby deriving only high frequency components above 50 kHz from output terminal 44. When switching first and second switches 52*a* and 52*b* to positions B and E respectively, the circuit is essentially DC coupled but rejects high frequency components above 50 kHz because the second filter with cutoff frequency $f_{c2}$ (e.g. 50 kHz) is interposed between input terminal 42 and amplifier 46. Since DC components are also transmitted, this mode may be called HF REJ/DC. The last coupling mode HF REJ/AC is achieved when switches 52*a* and 52*b* are respectively connected to positions B and D. In this condition, the upper cutoff frequencies to the non-inverting and inverting inputs to differential amplifier 46 are respectively $f_{c2}$ and $f_{c1}$, so that only the frequency components between $f_{c1}$ and $f_{c2}$ appear at output terminal 44. Since the DC component is essentially rejected, this mode is basically AC coupling with HF REJ, and more correctly, a bandpass function.

The operation of the entire circuit described above with different combinations of coupling selection switches 52*a* and 52*b* can be summarized as follows:

| switch 52a | switch 52b | coupling mode |
|---|---|---|
| A | C | LF REJ |
| A | D | AC |
| A | E | DC |
| B | D | HF REJ/AC |
| B | E | HF REJ/DC |

The switch position combination of B and C is invalid because the same signal is applied simultaneously to both inputs of differential amplifier 46, so that no signal output is produced at output terminal 44 over the entire frequency range. Although not shown in FIG. 3, a level control circuit may be interposed between switch 52*b* and amplifier 46 for trigger level control adjustment represented by potentiometer 28 in FIG. 1. In this manner, differential amplifier 46 is used not only for one part of trigger coupling circuit but also for the trigger generator. Such a circuit will be described below in detail by reference to FIG. 5.

FIG. 4 is a circuit schematic of one practical programmable trigger coupling circuit according to this invention. A plurality of input signals applied to input terminals 62*a*, 62*b*, . . . , 62*n* are selectively applied through selection switching circuit 64 to the base of emitter follower transistor 66. A selected input signal on the emitter of transistor 66 is directly applied to one fixed contact A and through a second filter network (resistor 54 and capacitor 56) to another fixed contact B of first coupling selection switch 52*a*. Switch 52*a* may suitably be an analog switch such as that described in copending U.S. Pat. No. 415,070, filed Sept. 7, 1982.

The emitter output of transistor 66 is also coupled through the aforementioned second filter network to the first fixed contact C and through a first filter network (resistor 48 and capacitor 50) to the second fixed contact D of second switch 52*b*. The third fixed contact E is grounded. Second switch 52*b* may also be an analog switch. The outputs from first and second switches 52*a*–52*b* are coupled to both input terminals (the bases of transistors $Q_{21}$ $Q_{22}$) of differential amplifier 46 comprising differentially coupled transistor pair $Q_{21}$ $Q_{22}$ and resistors $R_{10}$ through $R_{14}$.

Switching circuit 64 may be any conventional one including an analog switch, preferably an electronic switching circuit similar to switches 52*a*–52*b*.

The operation of the FIG. 4 circuit is essentially the same as described hereinbefore by reference to FIG. 3. The overall operation summarized in the above table is also applicable to this circuit, wherein the switch positions A through E in FIG. 3 are interpreted as control signals to terminals A through E in FIG. 4. It should be noted that desired trigger coupling may easily be selected by electrical or logic control means. That is, the trigger coupling circuit is suited for remote control.

Figure 5:
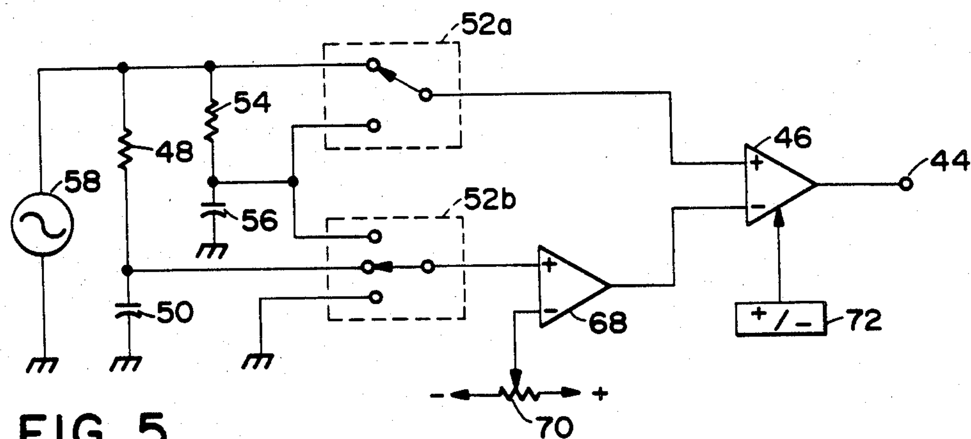
FIG. 5 is a block diagram of a trigger circuit according to the present invention.

FIG. 5 is a simplified schematic illustrating the principle of a trigger circuit according to this invention. This circuit is similar in construction to FIG. 3 except for the inclusion of level shifting amplifier 68 for controlling the output DC level by a controllable DC voltage from trigger level control potentiometer 70. Additionally, differential amplifier 46 is preferably a polarity switching type whose output polarity may be switched by polarity control 72.

The operation of FIG. 5 is also similar to FIG. 3 except for amplifier 68 and polarity switch 72, and therefore provides either one of AC, DC, LF REJ, HF REJ/DC and HF REJ/AC coupling modes by proper combination of two switches 52*a* and 52*b*. In addition to the trigger coupling mode selection, the trigger circuit further provides trigger level and polarity selection means for triggering on different level of the input signal and different slopes (either positive-going or negative-going portion) thereof. This allows an operator to trigger on any desired portion of the trigger signal waveform.

The foregoing description has been made on preferred embodiments of this invention. It will be apparent to those skilled in the art that many changes may be made to the preferred embodiments described herein without departing from the invention in its broader aspects. Consequently, the appended claims are intended to cover all such changes that fall within the scope of this invention.

What we claim as novel is:

1. A trigger coupling circuit for providing a plurality of coupling modes, comprising:

an input terminal for receiving a wideband electrical signal;

a high-frequency signal path coupled to said input terminal;

a low-pass filter coupled to said input terminal;

a subtraction circuit having a first and a second input, said first input coupled to said high-frequency signal path; and switch means coupled to said second input of said subtraction circuit, said switch means for selectively connecting one of an output from said low pass filter and a reference potential to said second input.

2. The trigger coupling circuit according to claim 1 wherein said low pass filter comprises a resistor and a capacitor.

3. The trigger coupling circuit according to claim 1 wherein said subtraction circuit is a differential amplifier.

4. The trigger coupling circuit according to claim 1 wherein said switch means is an electronic switch.

5. The trigger coupling circuit according to claim 16 further comprising a second low pass filter coupled to said input terminal and having a higher cutoff frequency than that of said first low pass filter, wherein said switch means further selectively connects one of an output from said first low pass filter and said second low pass filter and said reference potential to said second input of said subtraction circuit.

6. The trigger coupling circuit according to claim 5 wherein said switch means is an electronic switch.

7. The trigger coupling circuit according to claim 5 further including second switch means interposed in said high frequency signal path for selecting the signal through said high frequency signal path or an output from said second low pass filter.

8. The trigger coupling circuit according to claim 7 wherein said first and second switch means are electronic switches.

9. A programmable trigger coupling circuit, comprising:

a first and a second low pass filter and a high-frequency signal path connected to receive an input trigger signal;

a subtraction circuit having a first input and a second input for deriving therefrom an output trigger signal;

first switch means connected to said first input of said subtraction circuit for selectively coupling one of said second low pass filter and said high-frequency path to said first input;

second switch means connected to said second input of said subtraction circuit for selectively coupling one of said first and second low pass filters and a reference potential to said second input; and control means coupled to said first and second switch means for controlling the selection thereof.

10. The programmable trigger coupling circuit according to claim 9 wherein the cutoff frequency of said second low pass filter is higher than that of said first low pass filter.

11. The programmable trigger coupling circuit according to claim 9 wherein said substraction circuit is a differential amplifier.

12. A trigger circuit for providing a plurality of trigger coupling modes, comprising:

an input terminal for receiving an input trigger signal;

a differential amplifier having a pair of inputs and an output;

a high frequency signal path coupled between said input terminal and one input of said differential amplifier;

a low pass filter the input of which is connected to said input terminal;

switch means for selectively coupling one of the output of said low pass filter and a reference potential to the other input of said differential amplifier; and a selectably variable DC level shift circuit interposed between said switch means and said other input of said differential amplifier thereby to establish the output DC level of said differential amplifier.

13. The trigger circuit according to claim 12 wherein said switch means is an electronic switch.

14. The trigger circuit according to claim 12 further including a second low pass filter, connected to said input terminal, having a higher cutoff frequency than said first low pass filter, and wherein said switch means further selectively couples the output from said second low pass filter to said other input of said differential amplifier.

15. The trigger circuit according to claim 12 wherein said differential amplifier has polarity switching capability for providing an inverted output, and said level shift circuit includes means for generating a selectably variable DC voltage.

* * * * *